United States Patent
DeBrosse et al.

(10) Patent No.: US 8,228,706 B2
(45) Date of Patent: Jul. 24, 2012

(54) MAGNETIC SHIFT REGISTER MEMORY DEVICE

(75) Inventors: John K. DeBrosse, Colchester, VT (US); William J. Gallagher, Ardsley, NY (US); Yu Lu, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 706 days.

(21) Appl. No.: 12/168,379

(22) Filed: Jul. 7, 2008

(65) Prior Publication Data

US 2010/0002486 A1 Jan. 7, 2010

(51) Int. Cl.
*G11C 19/00* (2006.01)

(52) U.S. Cl. .......... 365/81; 365/130; 365/148; 365/158; 365/173; 977/933

(58) Field of Classification Search ............ 365/48, 365/55, 62, 66, 74, 78, 80–93, 100, 130, 365/131, 148, 158, 171–173, 209, 213, 225.5, 365/230.07, 232, 243.5; 216/22; 257/421, 257/E21.665; 428/810–816, 817–825.1, 428/826; 438/3; 977/933–935
See application file for complete search history.

(56) References Cited

U.S. PATENT DOCUMENTS

| | | | |
|---|---|---|---|
| 2004/0062074 A1 | 4/2004 | Ooishi | |
| 2004/0251232 A1* | 12/2004 | Chen et al. | 216/22 |
| 2004/0252538 A1* | 12/2004 | Parkin | 365/80 |
| 2004/0252539 A1* | 12/2004 | Parkin | 365/80 |
| 2005/0078509 A1* | 4/2005 | Parkin | 365/158 |
| 2005/0078511 A1* | 4/2005 | Parkin | 365/171 |
| 2005/0094427 A1* | 5/2005 | Parkin | 365/80 |
| 2005/0186686 A1* | 8/2005 | Chen et al. | 438/3 |
| 2006/0028866 A1* | 2/2006 | Parkin | 365/173 |
| 2006/0120132 A1* | 6/2006 | Parkin | 365/80 |
| 2007/0087454 A1* | 4/2007 | Chen et al. | 438/3 |
| 2007/0201264 A1 | 8/2007 | Shin et al. | |
| 2008/0080092 A1 | 4/2008 | Kim | |
| 2008/0080234 A1 | 4/2008 | Iwata et al. | |
| 2008/0094760 A1* | 4/2008 | Lee et al. | 360/324.11 |
| 2008/0100963 A1* | 5/2008 | Lee et al. | 360/131 |
| 2008/0253161 A1* | 10/2008 | Parkin et al. | 365/80 |

OTHER PUBLICATIONS

International Search Report and Written Opinion for PCT/US09/49381, consists of 9 pages.

* cited by examiner

*Primary Examiner* — Richard Elms
*Assistant Examiner* — Harry W Byrne

(57) ABSTRACT

In one embodiment, the invention is a magnetic shift register memory device. One embodiment of a memory cell includes a magnetic column including a plurality of magnetic domains, a reader coupled to the magnetic column, for reading data from the magnetic domains, a temporary memory for storing data read from the magnetic domains, and a writer coupled to the magnetic column, for writing data in the temporary memory to the magnetic domains.

18 Claims, 9 Drawing Sheets

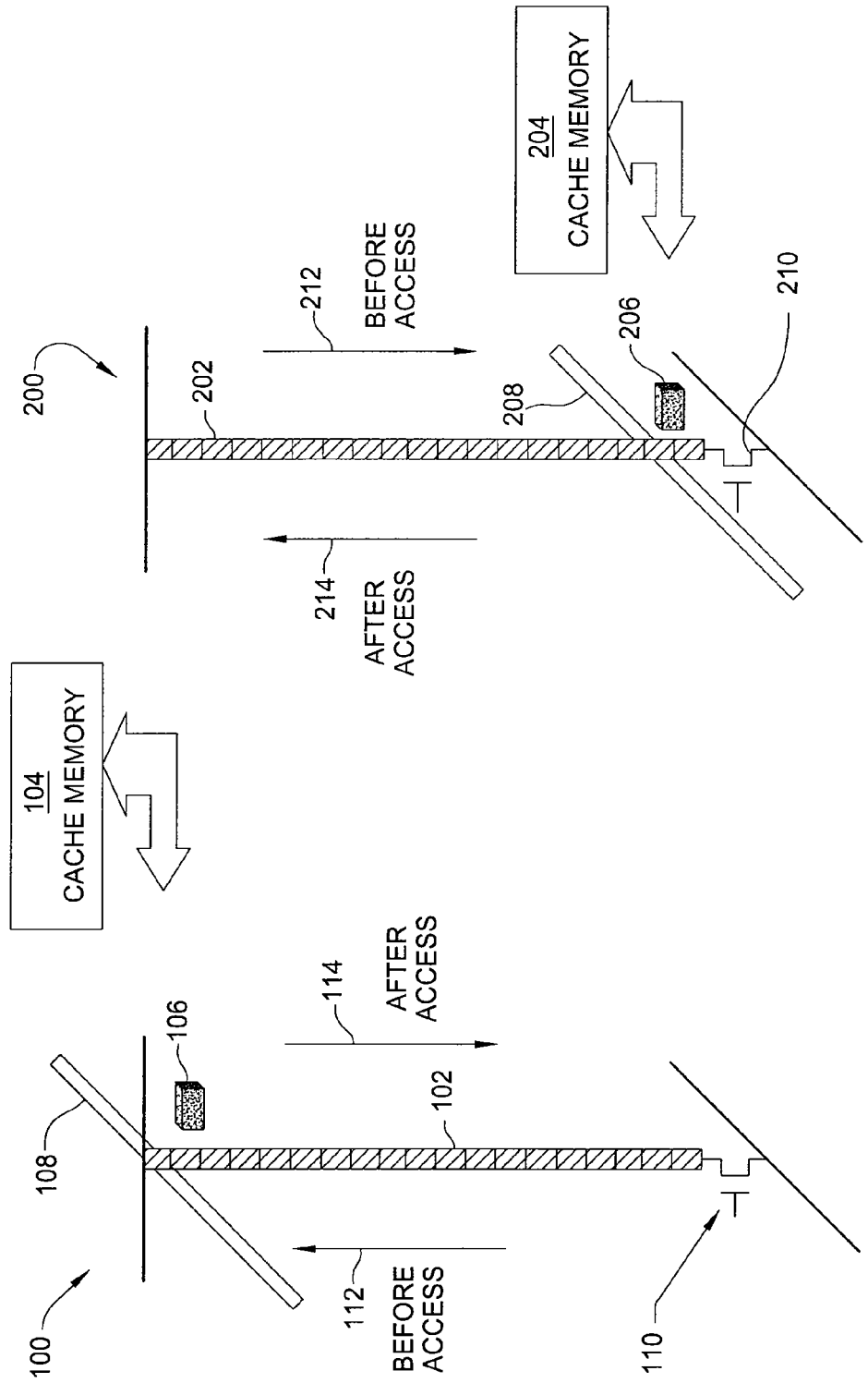

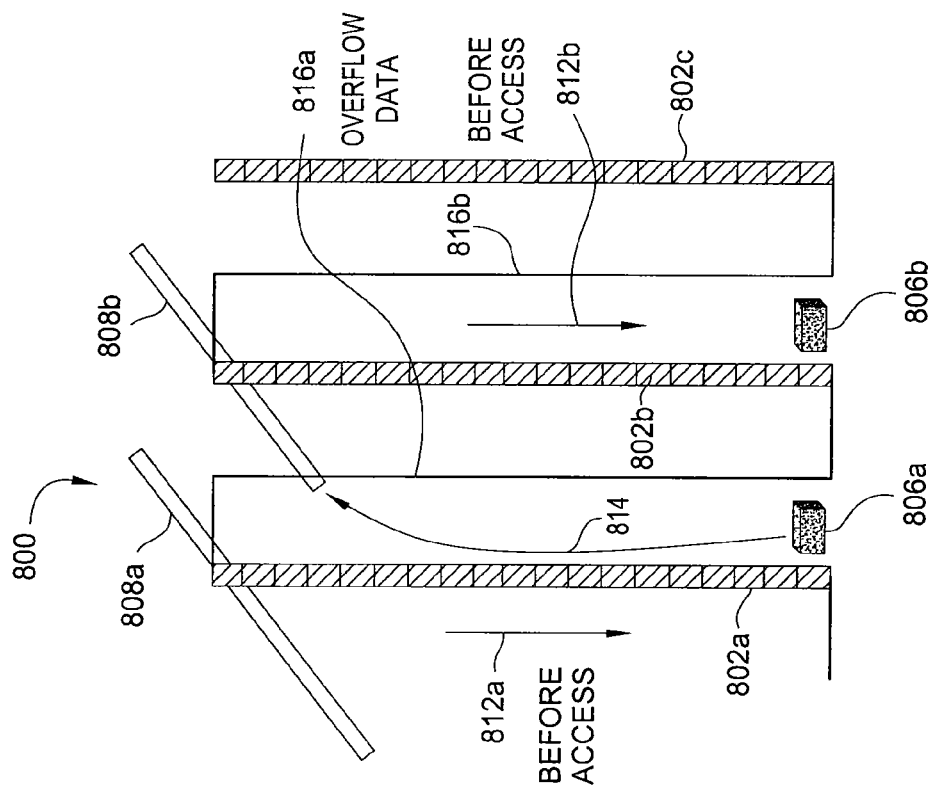
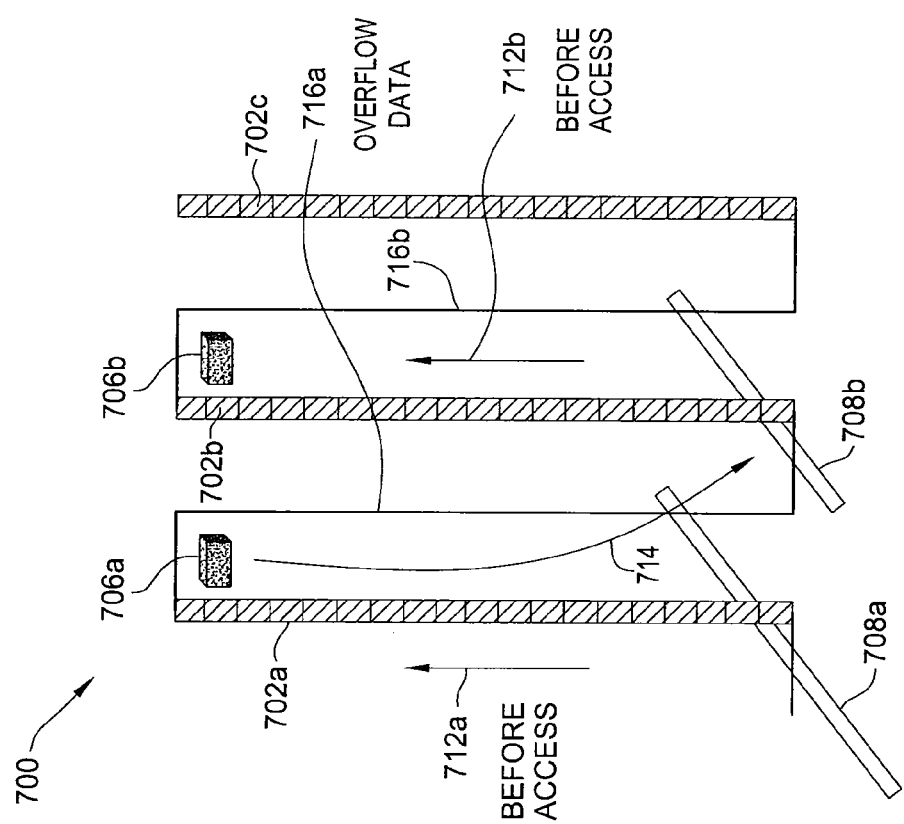

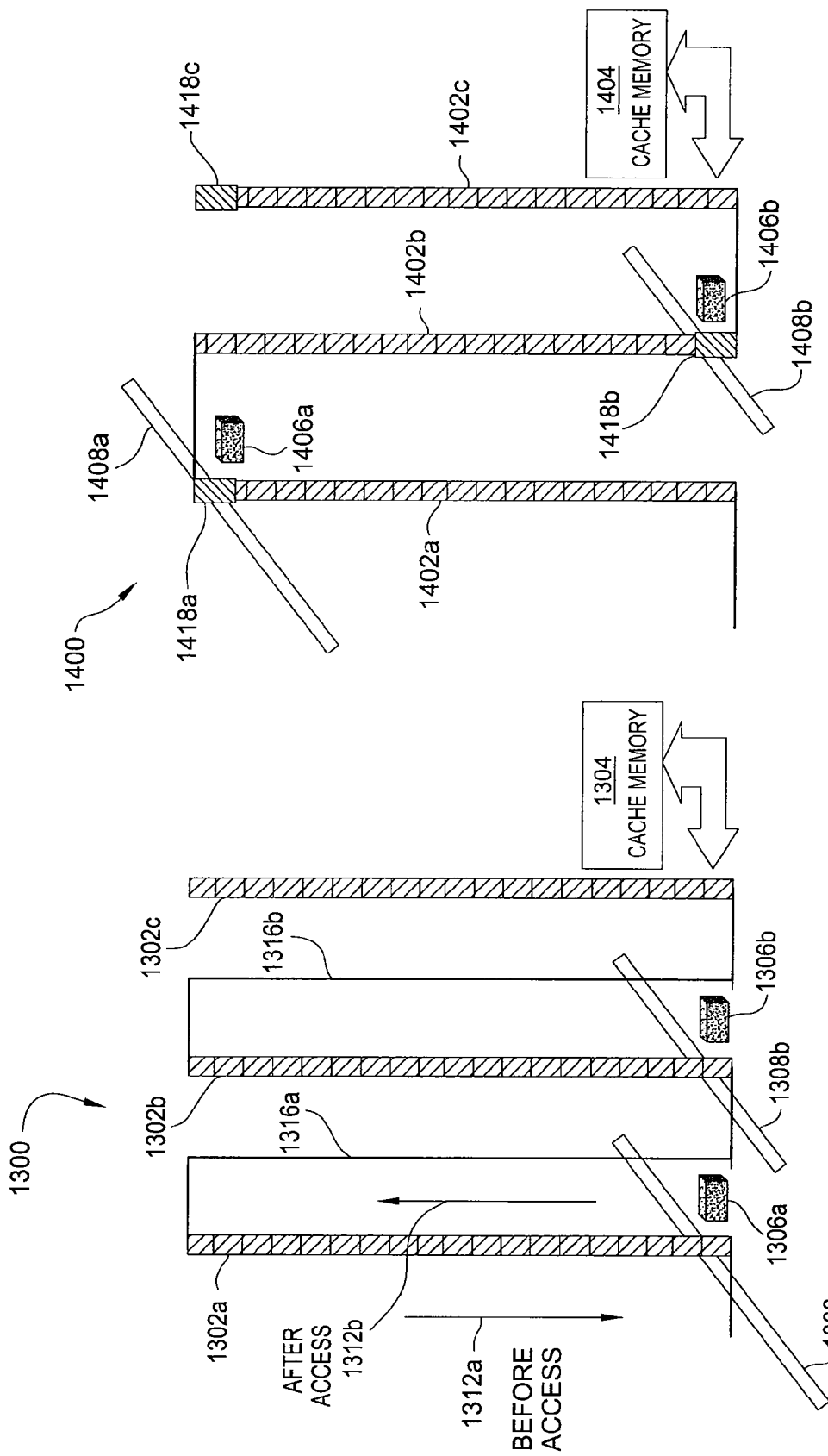

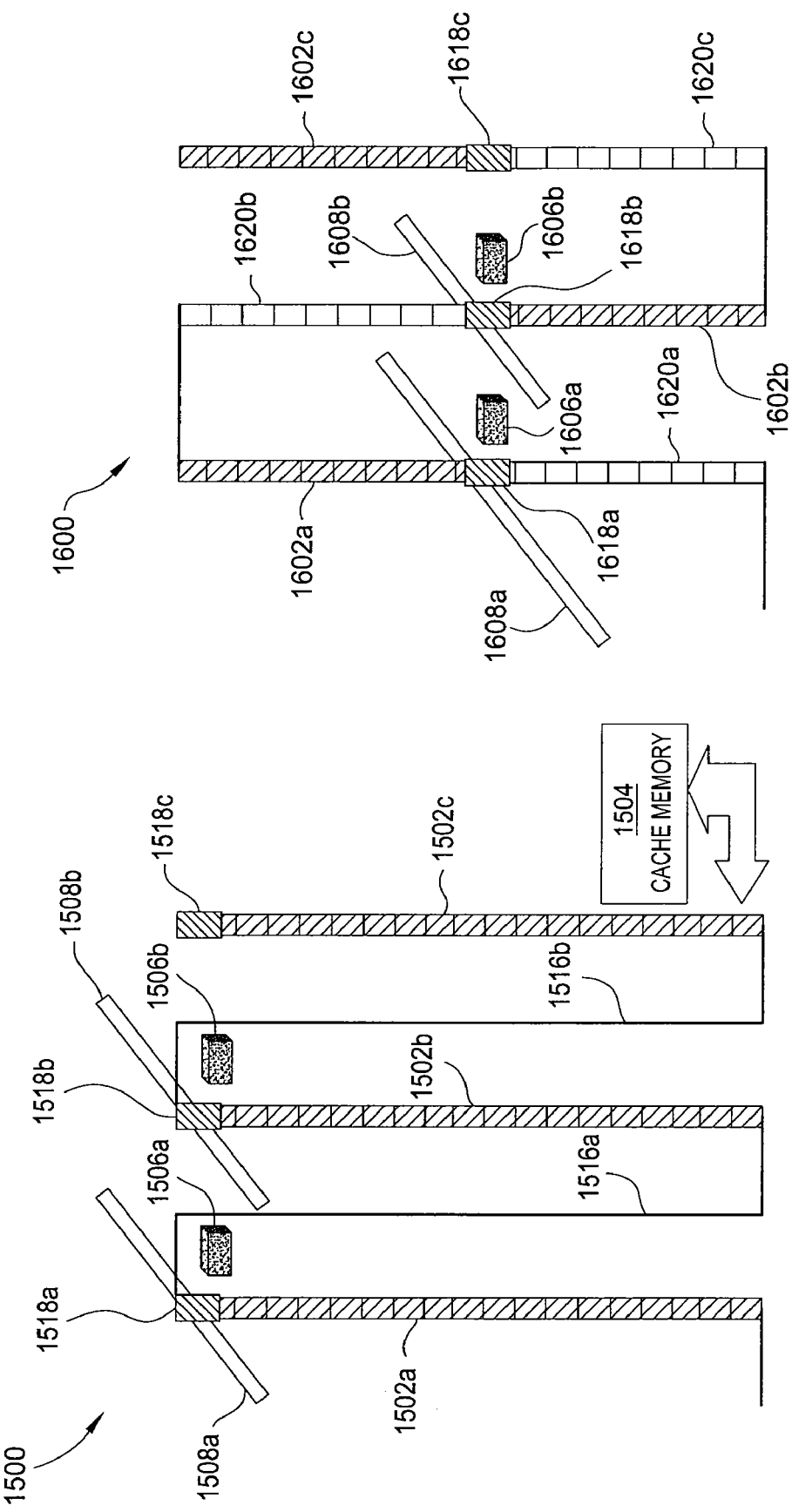

MAGNETIC SHIFT REGISTER MEMORY DEVICE

REFERENCE TO GOVERNMENT FUNDING

This invention was made with Government funding under Contract No. H94003-05-2-0505, awarded by the Department of Defense. The Government has certain rights in this invention.

BACKGROUND OF THE INVENTION

The present invention relates generally to digital data storage, and relates more particularly magnetic shift register memory.

Magnetic shift register memory that utilizes the manipulation of magnetic domains to store digital data has been proposed to potentially replace magnetic disc storage and even solid state non-volatile memory (e.g. flash memory). By stringing tens, or even hundreds, of magnetic domains (each domain representing one bit of digital data) along a shift register column (i.e., a magnetic column), the magnetic shift register memory efficiently uses the third dimension on the semiconductor chip to increase storage density and reduce cost per bit.

To perform read/write operations, a selected magnetic domain (as determined by address inputs of the memory) must be moved adjacent to a read/write device. Additional space (referred to as "reservoirs") must be allocated above and below the data section of the magnetic column in order to prevent data loss due to overflow as the entire train of domains moves up and down the magnetic column.

Conventional magnetic shift register memory requires electrical current in the range of one to ten miliamperes to move a magnetic domain. Since the resistivities of common magnetic alloys are in the range of ten to fifty micro-ohm-centimeters, a considerable voltage drop results across the magnetic column during moving operations. This limits the number of domains that can be moved in a single move operation (i.e., by a single application of electrical current).

Moreover, conventional magnetic shift register memory requires at least three semiconductor switches per magnetic column: a first switch to selectively read one bit, a second switch to selectively write one bit, and a third switch to move the magnetic domains along the magnetic column so that any particular bit is accessible for read/write operations. Since writing and moving both involve electrical currents on the order of miliamperes, at least two of these three switches will occupy substantial area in the magnetic shift register memory. Thus, a significant amount of space that could otherwise be dedicated to data storage (i.e., to magnetic domains) is occupied by the semiconductor components, and the storage density of the magnetic shift register memory cannot reach its full potential.

Thus, there is a need in the art for a method and apparatus for a magnetic shift register memory device with improved storage density.

SUMMARY OF THE INVENTION

In one embodiment, the invention is a magnetic shift register memory device. One embodiment of a memory cell includes a magnetic column consisting of a plurality of magnetic domains, a reader coupled to the magnetic column, for reading data from the magnetic domains, a temporary memory for storing data read from the magnetic domains, and a writer coupled to the magnetic column, for writing data in the temporary memory to the magnetic domains.

BRIEF DESCRIPTION OF THE DRAWINGS

So that the manner in which the above recited features of the present invention can be understood in detail, a more particular description of the invention may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 1 is a schematic diagram illustrating a first embodiment of a magnetic shift register memory device, according to the present invention;

FIG. 2 is a schematic diagram illustrating a second embodiment of a magnetic shift register memory device, according to the present invention;

FIG. 7 is a schematic diagram illustrating a seventh embodiment of a magnetic shift register memory device, according to the present invention;

FIG. 8 is a schematic diagram illustrating a eighth embodiment of a magnetic shift register memory device, according to the present invention;

FIG. 13 is a schematic diagram illustrating a thirteenth embodiment of a magnetic shift register memory device, according to the present invention;

FIG. 14 is a schematic diagram illustrating a fourteenth embodiment of a magnetic shift register memory device, according to the present invention;

FIG. 15 is a schematic diagram illustrating a fifteenth embodiment of a magnetic shift register memory device, according to the present invention;

FIG. 16 is a schematic diagram illustrating a sixteenth embodiment of a magnetic shift register memory device, according to the present invention;

DETAILED DESCRIPTION

Figure 4:
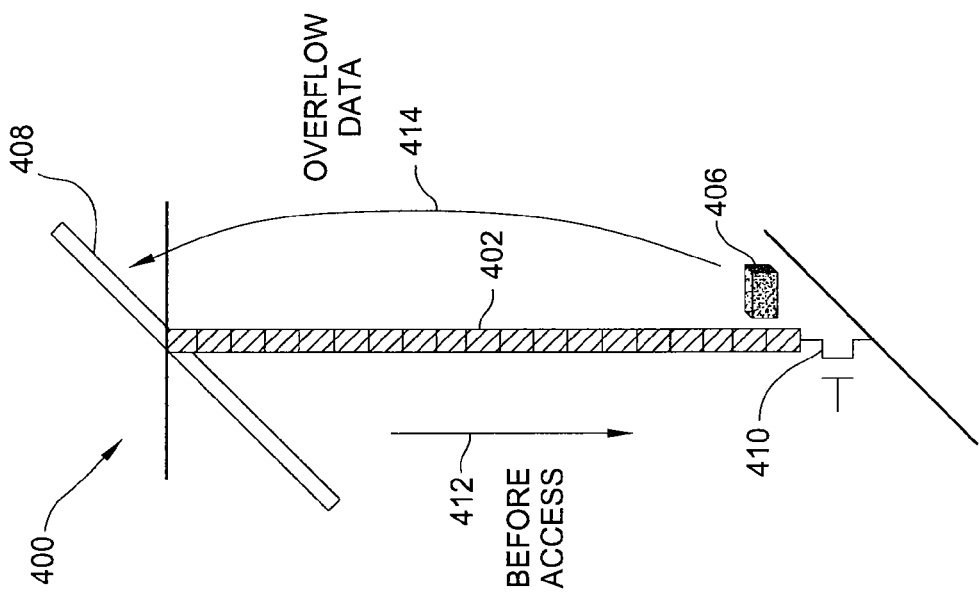
FIG. 4 is a schematic diagram illustrating a fourth embodiment of a magnetic shift register memory device, according to the present invention.

In one embodiment, the present invention is a magnetic shift register memory device with improved storage density. Embodiments of the present invention eliminate the need for large reservoirs in the magnetic columns, thereby enabling more efficient movement of magnetic domains. Further embodiments of the invention reduce the number of semiconductor switches per column required to perform read/write operations, thereby improving storage density.

FIG. 1 is a schematic diagram illustrating a first embodiment of a magnetic shift register memory device 100, according to the present invention. As illustrated, the device 100 comprises a magnetic column 102 (containing a plurality of magnetic domains), a temporary memory (e.g., cache memory) 104, a reader 106, a writer 108, and a semiconductor device 10.

The reader 106 and writer 108 are positioned together at a first end of the magnetic column 102, while the semiconductor device 110 is positioned at an opposite second end of the magnetic column 102.

In operation, the semiconductor device 110 moves a selected magnetic domain up the magnetic column 102 for access (i.e., moving toward the reader 106 and writer 108), as indicated by the arrow 112. The reader 106 then reads the state of a selected magnetic domain before the selected magnetic domain is moved beyond the "available" position of the magnetic column 102 and is lost. The state of the selected magnetic domain is then stored in the temporary memory 104, which is of equal or larger storage capacity than the magnetic column 102.

After the selected magnetic domain is accessed, the domain movement is reversed by the semiconductor device 10 (i.e., moving away from the reader 106 and writer 108), as indicated by the arrow 114. The data in the temporary memory 104 is written back onto the magnetic column 102 by the writer 108, thereby restoring the original content of the magnetic column 102, with the bit information in the accessed magnetic domain either also restored or else rewritten to a new intended data state if so required by a desired cell write operation.

FIG. 2 is a schematic diagram illustrating a second embodiment of a magnetic shift register memory device 200, according to the present invention. As illustrated, the device 200 comprises a magnetic column 202 (containing a plurality of magnetic domains), a temporary memory (e.g., cache memory) 204, a reader 206, a writer 208, and a semiconductor device 210.

The reader 206 and writer 208 are positioned together at a first end of the magnetic column 202. In contrast to the device 100 illustrated in FIG. 1, the semiconductor device 210 is also positioned at the first end of the magnetic column 202 (i.e., at the same end as the reader 206 and writer 208).

In operation, the semiconductor device 210 moves a selected magnetic domain down the magnetic column 202 for access (i.e., moving toward the reader 206 and writer 208), as indicated by the arrow 212. The reader 206 then reads the state of a selected magnetic domain before the selected magnetic domain is moved beyond the "available" position of the magnetic column 202 and is lost. The state of the selected magnetic domain is then stored in the temporary memory 204, which is of equal or larger storage capacity than the magnetic column 202.

After the selected magnetic domain is accessed, the domain movement is reversed by the semiconductor device 210 (i.e., moving away from the reader 206 and writer 208), as indicated by the arrow 214. The data in the temporary memory 204 is written back onto the magnetic column 202 by the writer 208, thereby restoring the original content of the magnetic column 202, with the bit information in the accessed magnetic domain either also restored or else rewritten to a new intended data state if so required by a desired cell write operation.

The configuration of the devices 100 and 200 illustrated in FIGS. 1 and 2 advantageously eliminates or reduces the need for reservoirs, which add length to the magnetic columns in conventional magnetic shift register memory devices. This reduction in magnetic column length allows a greater number of magnetic domains to be moved along the magnetic column in a single move operation (i.e., by a single application of electrical current).

Figure 3:
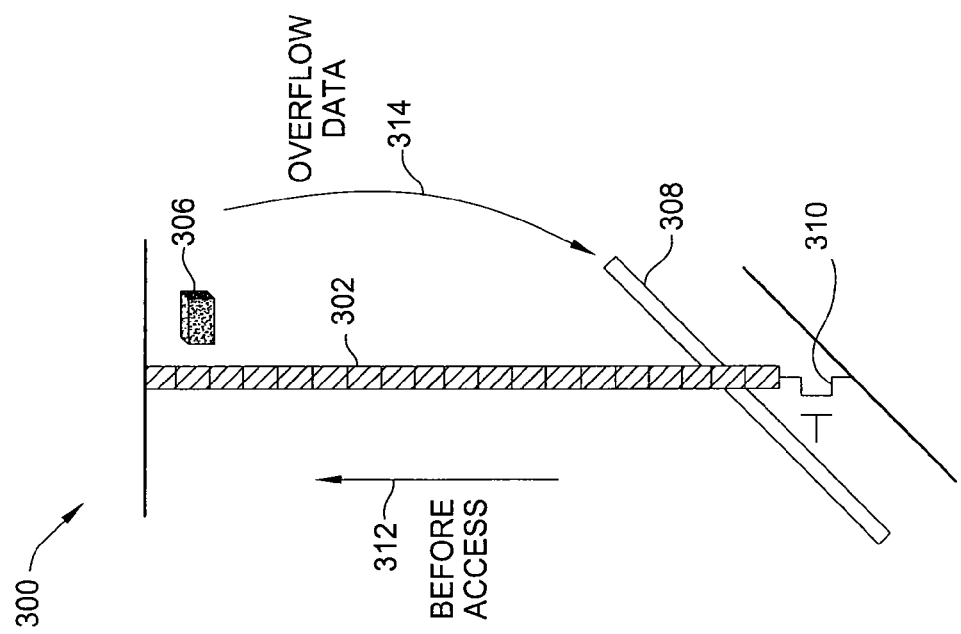
FIG. 3 is a schematic diagram illustrating a third embodiment of a magnetic shift register memory device, according to the present invention.

FIG. 3 is a schematic diagram illustrating a third embodiment of a magnetic shift register memory device 300, according to the present invention. As illustrated, the device 300 comprises a magnetic column 302 (containing a plurality of magnetic domains), a reader 306, a writer 308, and a semiconductor device 310.

The writer 308 and the semiconductor device 310 are positioned together at a first end of the magnetic column 302, while the reader 306 is positioned at an opposite second end of the magnetic column 302.

In operation, the semiconductor device 310 moves a selected magnetic domain up the magnetic column 302 for access (i.e., moving toward the reader 306), as indicated by the arrow 312. The reader 306 then reads the state of a selected magnetic domain before the selected magnetic domain is moved beyond the "available" position of the magnetic column 302 and is lost.

After the selected magnetic domain is accessed, the data is written back at the opposite end of the magnetic column 302 by the writer 308, so that data moves in a substantially circular manner (as indicated by the arrow 314) as the magnetic domains are moved to access the selected magnetic domain. After the selected magnetic domain has been accessed, the movement of the magnetic domains can be continued until one full period of movement has been completed, thereby restoring the original content of the magnetic column 302, with the bit information in the accessed magnetic domain either also restored or else rewritten to a new intended data state if so required by a desired cell write operation.

FIG. 4 is a schematic diagram illustrating a fourth embodiment of a magnetic shift register memory device 400, according to the present invention. As illustrated, the device 400 comprises a magnetic column 402 (containing a plurality of magnetic domains), a reader 406, a writer 408, and a semiconductor device 410.

The reader 406 and the semiconductor device 410 are positioned together at a first end of the magnetic column 402, while the writer 408 is positioned at an opposite second end of the magnetic column 402.

In operation, the semiconductor device 410 moves a selected magnetic domain down the magnetic column 402 for access (i.e., moving toward the reader 406), as indicated by the arrow 412. The reader 406 then reads the state of a selected magnetic domain before the selected magnetic domain is moved beyond the "available" position of the magnetic column 402 and is lost.

After the selected magnetic domain is accessed, the data is written back at the opposite end of the magnetic column 402 by the writer 408, so that data moves in a substantially circular manner (as indicated by the arrow 414) as the magnetic domains are moved to access the selected magnetic domain. After the selected magnetic domain has been accessed, the movement of the magnetic domains can be continued until one full period of movement has been completed, thereby restoring the original content of the magnetic column 402, with the bit information in the accessed magnetic domain either also restored or else rewritten to a new intended data state if so required by a desired cell write operation.

Similar to the devices 100 and 200 illustrated in FIGS. 1 and 2, the configuration of the devices 300 and 400 illustrated in FIGS. 3 and 4 advantageously eliminates or reduces the need for reservoirs, which add length to the magnetic columns in conventional magnetic shift register memory devices. This reduction in magnetic column length allows a greater number of magnetic domains to be moved along the magnetic column in a single move operation (i.e., by a single application of electrical current). Moreover, the devices 300 and 400 confer the additional advantage of not requiring temporary memory to cache data.

Figure 5:
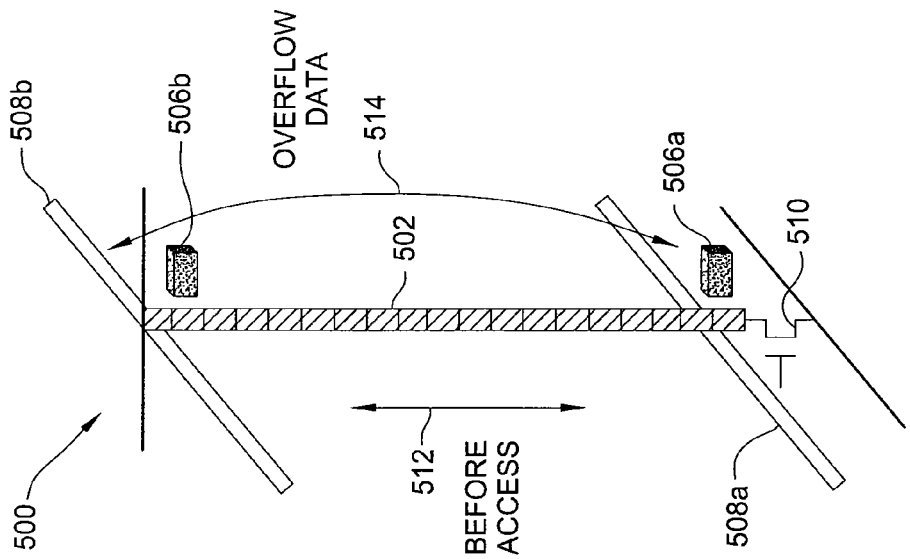
FIG. 5 is a schematic diagram illustrating a fifth embodiment of a magnetic shift register memory device, according to the present invention.

FIG. 5 is a schematic diagram illustrating a fifth embodiment of a magnetic shift register memory device 500, according to the present invention. As illustrated, the device 500 comprises a magnetic column 502 (containing a plurality of magnetic domains), a first reader 506a, a second reader 506b, a first writer 508a, a second writer 508b, and a semiconductor device 510.

The first reader 506a, the first writer 508a, and the semiconductor device 510 are positioned together at a first end of the magnetic column 502, while the second reader 506b and the second writer 508b are positioned at an opposite second end of the magnetic column 502.

In operation, the semiconductor device 510 moves a selected magnetic domain up or down the magnetic column 502 for access (i.e., moving toward either the first reader 506a or the second reader 506b), as indicated by the arrow 512. The first reader 506a or the second reader 506b then reads the state of a selected magnetic domain before the selected magnetic domain is moved beyond the "available" position of the magnetic column 502 and is lost.

After the selected magnetic domain is accessed, the data is written back at the opposite end of the magnetic column 502 by the second writer 508b or the first writer 508a (i.e., whichever writer is positioned at the opposite end of the magnetic column 502 from the reader that read the selected magnetic domain), so that data moves in a substantially circular manner (as indicated by the arrow 514) as the magnetic domains are moved to access the selected magnetic domain. After the selected magnetic domain has been accessed, the movement of the magnetic domains can be continued until one full period of movement has been completed, thereby restoring the original content of the magnetic column 502, with the bit information in the accessed magnetic domain either also restored or else rewritten to a new intended data state if so required by a desired cell write operation. Thus, the magnetic domains can be moved in whichever direction requires the fewest number of move operations to reach the selected magnetic domain, with one reader/writer pair (i.e., either first reader 506a and first writer 508a or second reader 506b and second writer 508b) activated at a time.

Similar to the devices 100-400 illustrated in FIGS. 1-4, the configuration of the device 500 illustrated in FIG. 5 advantageously eliminates or reduces the need for reservoirs, which add length to the magnetic columns in conventional magnetic shift register memory devices. This reduction in magnetic column length allows a greater number of magnetic domains to be moved along the magnetic column in a single move operation (i.e., by a single application of electrical current). Moreover, the device 500 confers the additional advantage of not requiring temporary memory to cache data. In addition, the device 500 minimizes movement of the magnetic domains, thereby reducing the power and time required for each access operation.

Figure 6:
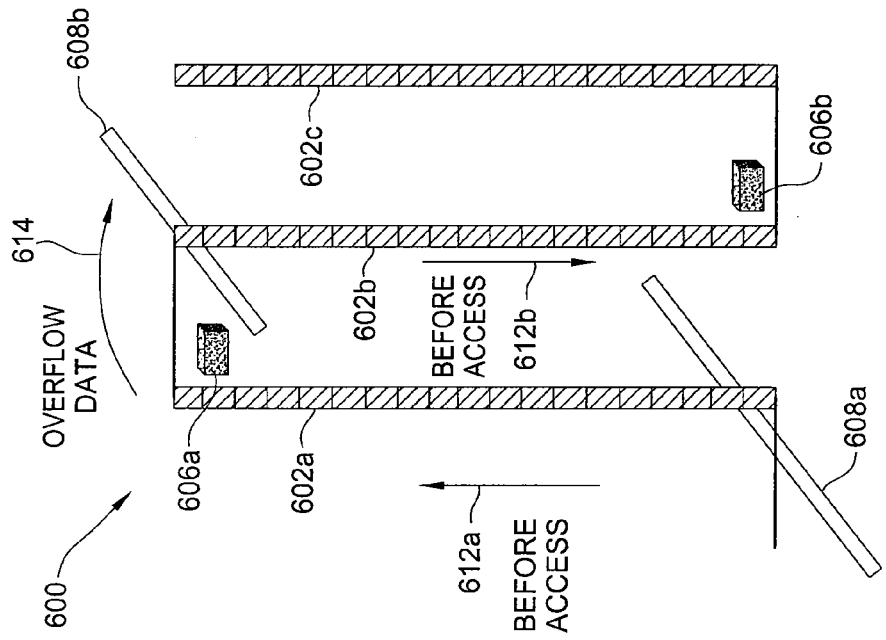
FIG. 6 is a schematic diagram illustrating a sixth embodiment of a magnetic shift register memory device, according to the present invention.

FIG. 6 is a schematic diagram illustrating a sixth embodiment of a magnetic shift register memory device 600, according to the present invention. As illustrated, the device 600 comprises a plurality of magnetic columns 602a-602c (hereinafter collectively referred to as "magnetic columns 602", each containing a plurality of magnetic domains), a first reader 606a, a second reader 606b, a first writer 608a, and a second writer 608b.

The plurality of magnetic columns 602 is arranged in a chain configuration such that adjacent magnetic columns 602 are electrically connected along the wordline dimension of the device 600.

The first reader 606a is positioned at a first end of the first magnetic column 602a, while the first writer 608a is positioned at an opposite second end of the first magnetic column 602a. The second writer 608b is positioned at a first end of the second magnetic column 602b (i.e., laterally adjacent to the first reader 606a), while the second reader 606b is positioned at an opposite second end of the second magnetic column 602b (i.e., laterally adjacent to the first writer 608a). In this way, data can move up and down the magnetic columns 602 in an alternating manner (i.e., up one magnetic column, down the next magnetic column, etc.) while alternatively encountering readers and writers (i.e., a writer is encountered after a reader, and vice versa).

In operation, a selected magnetic domain is moved up the first magnetic column 602a for access (i.e., moving toward the first reader 606a), as indicated by the arrow 612a. The first reader 606a then reads the state of a selected magnetic domain before the selected magnetic domain is moved beyond the "available" position of the first magnetic column 602a and is lost.

After the selected magnetic domain is accessed, the data is written to the first magnetic domain of the second magnetic column 602b by the second writer 608b (as illustrated by arrow 614) and moved down the second magnetic column 602b for access (i.e., moving toward the second reader 606b), as indicated by the arrow 612b. Data read by a reader associated with the last magnetic column of the chain (i.e., the second reader 606b in FIG. 6) is written back to the first magnetic domain of the first magnetic column 602a, so that data flows through the chain of magnetic columns 602 in a substantially circular manner. After the selected magnetic domain has been accessed, the movement of the magnetic domains can be continued until one full period of movement has been completed, thereby restoring the original content of the magnetic column 602, with the bit information in the accessed magnetic domain either also restored or else rewritten to a new intended data state if so required by a desired cell write operation.

Those skilled in the art will appreciate that the device 600 is illustrated as comprising three magnetic columns 606 and two reader/writer pairs for the purposes of simplicity only. A magnetic shift register memory device configured according to the embodiment illustrated in FIG. 6 may comprise any number of magnetic columns and reader/writer pairs configured substantially as illustrated.

FIG. 7 is a schematic diagram illustrating a seventh embodiment of a magnetic shift register memory device 700, according to the present invention. As illustrated, the device 700 comprises a plurality of magnetic columns 702a-702c (hereinafter collectively referred to as "magnetic columns 702", each containing a plurality of magnetic domains), a first reader 706a, a second reader 706b, a first writer 708a, and a second writer 708b.

The plurality of magnetic columns 702 is arranged in a chain configuration such that adjacent magnetic columns 702 are electrically connected along the wordline dimension of the device 700. In addition, a plurality of vias 716a-716b (hereinafter collectively referred to as "vias 716") connects the plurality of magnetic columns 702.

The first reader 706a is positioned at a first end of the first magnetic column 702a, while the first writer 708a is positioned at an opposite second end of the first magnetic column 702a. The second reader 706b is positioned at a first end of the second magnetic column 702b (i.e., laterally adjacent to the first reader 706a), while the second writer 708b is positioned at an opposite second end of the second magnetic column 702b (i.e., laterally adjacent to the first writer 708a). In this way, data can move in the same direction (e.g., up) in each of the magnetic columns 702, while alternatively encountering readers and writers (i.e., a writer is encountered after a reader, and vice versa).

In operation, a selected magnetic domain is moved up the first magnetic column 702a for access (i.e., moving toward the first reader 706a), as indicated by the arrow 712a. The first reader 706a then reads the state of a selected magnetic domain before the selected magnetic domain is moved beyond the "available" position of the first magnetic column 702a and is lost.

After the selected magnetic domain is accessed, the data is moved down the first via 716a and written to the first magnetic domain of the second magnetic column 702b by the second writer 708b (as illustrated by arrow 714). The data is then moved up the second magnetic column 702b for access (i.e., moving toward the second reader 706b), as indicated by the arrow 712b. Data read by a reader associated with the last magnetic column of the chain (i.e., the second reader 706b in FIG. 7) is written back to the first magnetic domain of the first magnetic column 702a, so that data flows through the chain of magnetic columns 702 in a substantially circular manner. After the selected magnetic domain has been accessed, the movement of the magnetic domains can be continued until one full period of movement has been completed, thereby restoring the original content of the magnetic column 702, with the bit information in the accessed magnetic domain either also restored or else rewritten to a new intended data state if so required by a desired cell write operation.

Those skilled in the art will appreciate that the device 700 is illustrated as comprising three magnetic columns 706 and two reader/writer pairs for the purposes of simplicity only. A magnetic shift register memory device configured according to the embodiment illustrated in FIG. 7 may comprise any number of magnetic columns and reader/writer pairs configured substantially as illustrated.

FIG. 8 is a schematic diagram illustrating an eighth embodiment of a magnetic shift register memory device 800, according to the present invention. As illustrated, the device 800 comprises a plurality of magnetic columns 802a-802c (hereinafter collectively referred to as "magnetic columns 802", each containing a plurality of magnetic domains), a first reader 806a, a second reader 806b, a first writer 808a, and a second writer 808b.

The plurality of magnetic columns 802 is arranged in a chain configuration such that adjacent magnetic columns 802 are electrically connected along the wordline dimension of the device 800. In addition, a plurality of vias 816a-816b (hereinafter collectively referred to as "vias 816") connects the plurality of magnetic columns 802.

The first reader 806a is positioned at a first end of the first magnetic column 802a, while the first writer 808a is positioned at an opposite second end of the first magnetic column 802a. The second reader 806b is positioned at a first end of the second magnetic column 802b (i.e., laterally adjacent to the first reader 806a), while the second writer 808b is positioned at an opposite second end of the second magnetic column 802b (i.e., laterally adjacent to the first writer 808a). In this way, data can in the same direction (e.g., down) in each of the magnetic columns 802, while alternatively encountering readers and writers (i.e., a writer is encountered after a reader, and vice versa).

In operation, a selected magnetic domain is moved down the first magnetic column 802a for access (i.e., moving toward the first reader 806a), as indicated by the arrow 812a. The first reader 806a then reads the state of a selected magnetic domain before the selected magnetic domain is moved beyond the "available" position of the first magnetic column 802a and is lost.

After the selected magnetic domain is accessed, the data is moved up the first via 816a and written to the first magnetic domain of the second magnetic column 802b by the second writer 808b (as illustrated by arrow 814). The data is then moved down the second magnetic column 802b for access (i.e., moving toward the second reader 806b), as indicated by the arrow 812b. Data read by a reader associated with the last magnetic column of the chain (i.e., the second reader 806b in FIG. 8) is written back to the first magnetic domain of the first magnetic column 802a, so that data flows through the chain of magnetic columns 802 in a substantially circular manner. After the selected magnetic domain has been accessed, the movement of the magnetic domains can be continued until one full period of movement has been completed, thereby restoring the original content of the magnetic column 802, with the bit information in the accessed magnetic domain either also restored or else rewritten to a new intended data state if so required by a desired cell write operation.

Those skilled in the art will appreciate that the device 800 is illustrated as comprising three magnetic columns 806 and two reader/writer pairs for the purposes of simplicity only. A magnetic shift register memory device configured according to the embodiment illustrated in FIG. 8 may comprise any number of magnetic columns and reader/writer pairs configured substantially as illustrated.

Similar to the devices 100-500 illustrated in FIGS. 1-5, the configuration of the devices 600-800 illustrated in FIGS. 6-8 advantageously eliminates or reduces the need for reservoirs, which add length to the magnetic columns in conventional magnetic shift register memory devices. This reduction in magnetic column length allows a greater number of magnetic domains to be moved along the magnetic column in a single move operation (i.e., by a single application of electrical current). Additionally, configuring the magnetic columns as a chain allows for continuous movement of magnetic domains along the chain, thereby eliminating the need for a semiconductor device similar to those illustrated in FIGS. 1-5 to control domain movement. Moreover, the devices 300-800 confer the additional advantage of not requiring temporary memory to cache data. In addition, the devices 600-800 allow for sharing of move operations (i.e., applied electrical currents) and among a large number of magnetic columns. Furthermore, as compared with the embodiment illustrated in FIG. 6, the devices 700-800 place all readers 706, 806 at one end of the magnetic columns 702, 802 and all writers 708, 808 at the opposite end of the magnetic columns 702, 802, thereby reducing the complexity (and cost) of fabricating the magnetic shift register memory.

Figure 9:
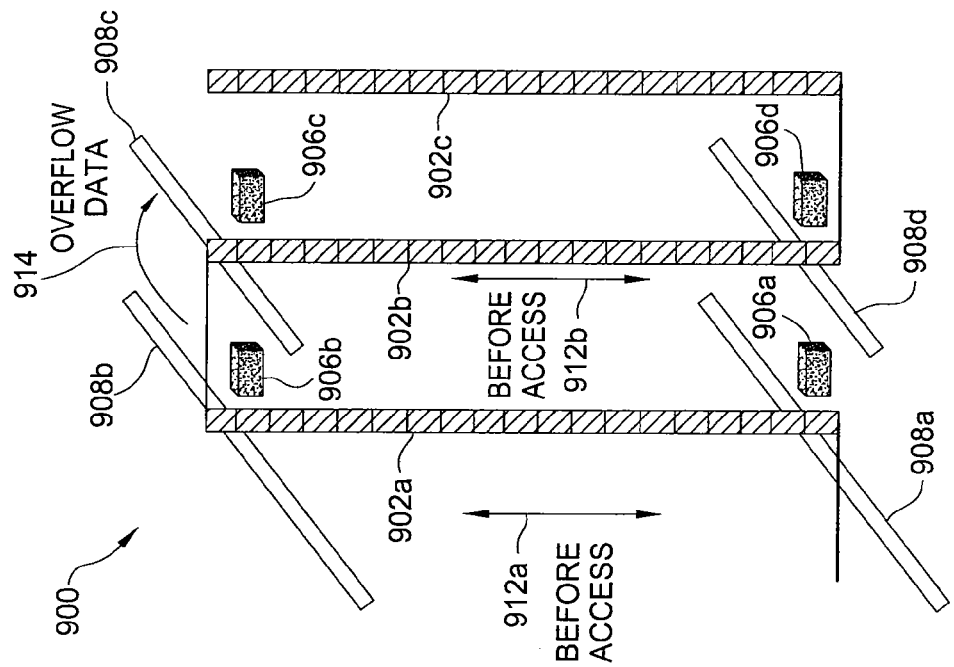
FIG. 9 is a schematic diagram illustrating a ninth embodiment of a magnetic shift register memory device, according to the present invention.

FIG. 9 is a schematic diagram illustrating a ninth embodiment of a magnetic shift register memory device 900, according to the present invention. As illustrated, the device 900 comprises a plurality of magnetic columns 902a-902c (hereinafter collectively referred to as "magnetic columns 902", each containing a plurality of magnetic domains), a first reader 906a, a second reader 906b, a third reader 906, a fourth reader 906d, a first writer 908a, a second writer 908b, a third writer 908c, and a fourth writer 908d.

The plurality of magnetic columns 902 is arranged in a chain configuration such that adjacent magnetic columns 902 are electrically connected along the wordline dimension of the device 900.

The first reader 906a and first writer 908a are positioned at a first end of the first magnetic column 902a, while the second reader 906b and the second writer 908b are positioned at an opposite second end of the first magnetic column 902a. Similarly, the third reader 906c and the third writer 908c are positioned at a first end of the second magnetic column 902b, while the fourth reader 906d and the fourth writer 908d are positioned at an opposite second end of the second magnetic column 902b. Thus, each magnetic column 902 has a reader/writer pair positioned at each end. In this way, data can move not only up and down the magnetic columns 902 in an alternating manner (i.e., up one magnetic column, down the next magnetic column, etc.) while alternatively encountering readers and writers (i.e., a writer is encountered after a reader, and vice versa), but domains can be moved in either direction (i.e., up or down) in each magnetic column 902.

In operation, a selected magnetic domain is moved up or down the first magnetic column 902a for access (i.e., moving toward the first reader 906a or the second reader 906b), as indicated by the arrow 912a. Specifically, the selected magnetic domain is moved in whichever direction requires the least number of movements to move the selected magnetic domain into an accessible position, with one reader/writer pair activated. The first reader 906a or second reader 906b then reads the state of a selected magnetic domain before the selected magnetic domain is moved beyond the "available" position of the first magnetic column 902a and is lost.

After the selected magnetic domain is accessed, the direction of movement is reversed, and the data is written to the first magnetic domain of the adjacent magnetic column 902 by the writer of the next reader/writer pair. For instance, if the selected magnetic domain was moved toward the second reader 906b for access, the data from the selected magnetic domain will be written to the first magnetic domain of the second magnetic column 902b by the third writer 908c (as illustrated by arrow 914). The data is then moved down the second magnetic column 902b for access (i.e., moving toward the fourth reader 906d), as indicated by the arrow 912b.

Those skilled in the art will appreciate that the device 900 is illustrated as comprising three magnetic columns 906 and four reader/writer pairs for the purposes of simplicity only. A magnetic shift register memory device configured according to the embodiment illustrated in FIG. 9 may comprise any number of magnetic columns and reader/writer pairs configured substantially as illustrated.

Figure 10:
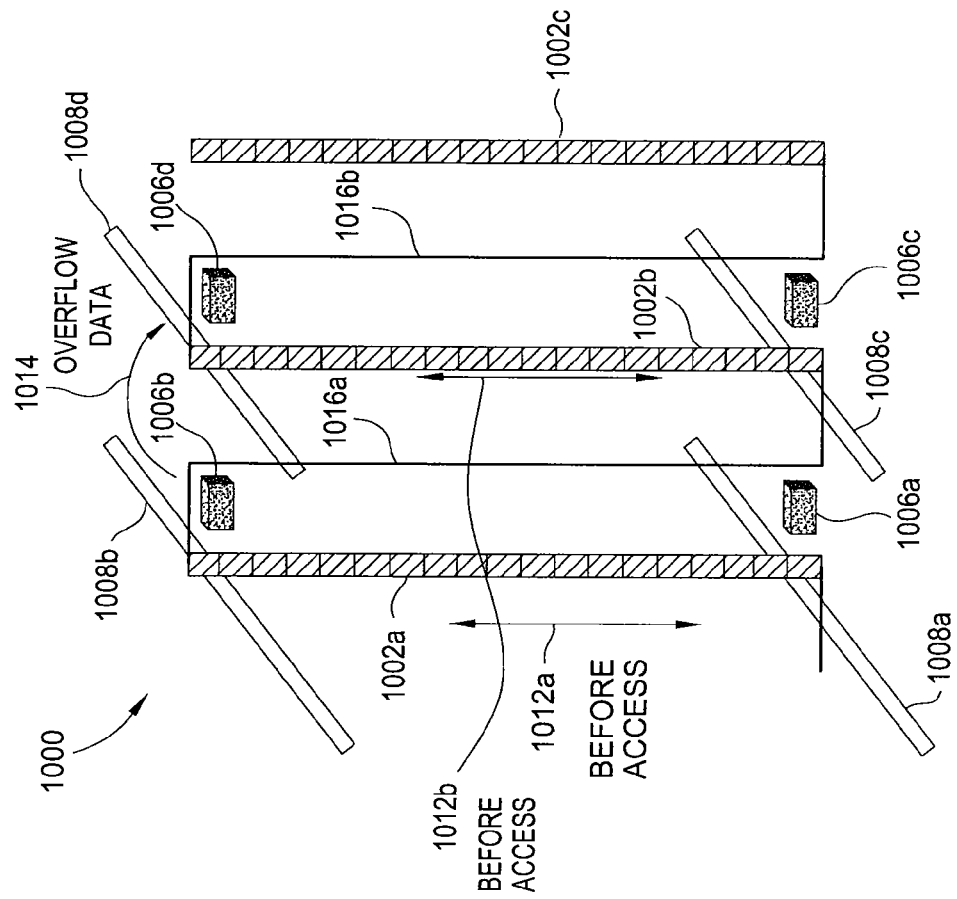
FIG. 10 is a schematic diagram illustrating a tenth embodiment of a magnetic shift register memory device, according to the present invention.

FIG. 10 is a schematic diagram illustrating a tenth embodiment of a magnetic shift register memory device 1000, according to the present invention. As illustrated, the device 1000 comprises a plurality of magnetic columns 1002a-1002c (hereinafter collectively referred to as "magnetic columns 1002", each containing a plurality of magnetic domains), a first reader 1006a, a second reader 1006b, a third reader 1006, a fourth reader 1006d, a first writer 1008a, a second writer 1008b, a third writer 1008c, and a fourth writer 1008d.

The plurality of magnetic columns 1002 is arranged in a chain configuration such that adjacent magnetic columns 1002 are electrically connected along the wordline dimension of the device 1000. In addition, a plurality of vias 1016a-1016b (hereinafter collectively referred to as "vias 1016") connects the plurality of magnetic columns 1002.

The first reader 1006a and first writer 1008a are positioned at a first end of the first magnetic column 1002a, while the second reader 1006b and the second writer 1008b are positioned at an opposite second end of the first magnetic column 1002a. Similarly, the third reader 1006c and the third writer 1008c are positioned at a first end of the second magnetic column 1002b, while the fourth reader 1006d and the fourth writer 1008d are positioned at an opposite second end of the second magnetic column 1002b. Thus, each magnetic column 1002 has a reader/writer pair positioned at each end. In this way, data can move not only up and down the magnetic columns 1002 in an alternating manner (i.e., up one magnetic column, down the next magnetic column, etc.) while alternatively encountering readers and writers (i.e., a writer is encountered after a reader, and vice versa), but domains can be moved in either direction (i.e., up or down) in each magnetic column 1002.

In operation, a selected magnetic domain is moved up or down the first magnetic column 1002a for access (i.e., moving toward the first reader 1006a or the second reader 1006b), as indicated by the arrow 1012a. Specifically, the selected magnetic domain is moved in whichever direction requires the least number of movements to move the selected magnetic domain into an accessible position, with one reader/writer pair activated. The first reader 1006a or second reader 1006b then reads the state of a selected magnetic domain before the selected magnetic domain is moved beyond the "available" position of the first magnetic column 1002a and is lost.

After the selected magnetic domain is accessed, the direction of movement is reversed, and the data travels up or down the first via 1016a and is written to the first magnetic domain of the adjacent magnetic column 1002 by the writer of the next reader/writer pair. For instance, if the selected magnetic domain was moved toward the second reader 1006b for access, the data from the selected magnetic domain will move down the first via 1016a and be written to the first magnetic domain of the second magnetic column 1002b by the third writer 1008c (as illustrated by arrow 1014). The data is then moved up or down the second magnetic column 1002b for access (i.e., moving toward the third reader 1006c or the fourth reader 1006d), as indicated by the arrow 1012b.

Those skilled in the art will appreciate that the device 1000 is illustrated as comprising three magnetic columns 1006 and four reader/writer pairs for the purposes of simplicity only. A magnetic shift register memory device configured according to the embodiment illustrated in FIG. 10 may comprise any number of magnetic columns and reader/writer pairs configured substantially as illustrated.

Similar to the devices 100-800 illustrated in FIGS. 1-8, the configuration of the devices 900-1000 illustrated in FIGS. 9-10 advantageously eliminates or reduces the need for reservoirs, which add length to the magnetic columns in conventional magnetic shift register memory devices. This reduction in magnetic column length allows a greater number of magnetic domains to be moved along the magnetic column in a single move operation (i.e., by a single application of electrical current). Additionally, configuring the magnetic columns as a chain allows for continuous movement of magnetic domains along the chain, thereby eliminating the need for a semiconductor device similar to those illustrated in FIGS. 1-5 to control domain movement. Moreover, the devices 900-1000 confer the additional advantage of not requiring temporary memory to cache data. In addition, the devices 900-1000 minimize movement of the magnetic domains, thereby reducing the power and time required for each access operation.

Figure 11:
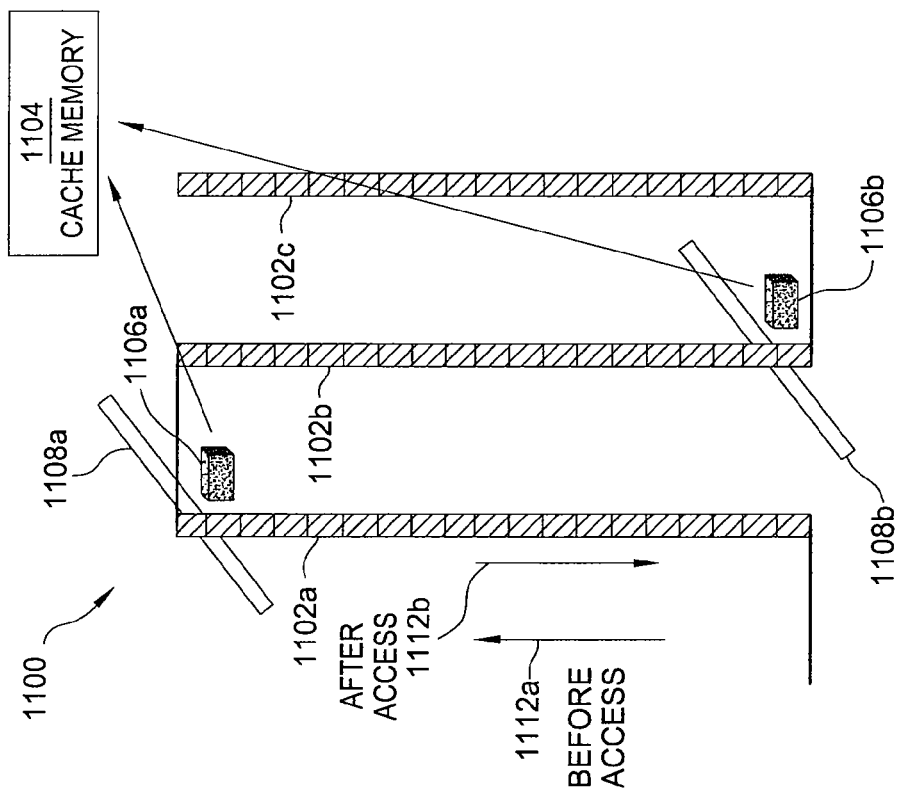
FIG. 11 is a schematic diagram illustrating a eleventh embodiment of a magnetic shift register memory device, according to the present invention.

FIG. 11 is a schematic diagram illustrating an eleventh embodiment of a magnetic shift register memory device 1100, according to the present invention. As illustrated, the device 1100 comprises a plurality of magnetic columns 1102a-1102c (hereinafter collectively referred to as "magnetic columns 1102", each containing a plurality of magnetic domains), a first reader 1106a, a second reader 1106b, a first writer 1108a, a second writer 1108b, and a temporary memory (e.g., cache memory) 1104.

The plurality of magnetic columns 1102 is arranged in a chain configuration such that adjacent magnetic columns 1102 are electrically connected along the wordline dimension of the device 1100.

The first reader 1106a and first writer 1108a are positioned at a first end of the first magnetic column 1102a, while the second reader 1106b and the second writer 1108b are positioned at an opposite second end of the second magnetic column 1102b. Thus, each magnetic column 1102 has a reader/writer pair positioned at either its first end or its second end.

To access a particular magnetic domain in any of the magnetic columns 1102, the entire chain of magnetic columns 1102 must be moved. It is most efficient to access at least some of the magnetic domains from several of the magnetic columns 1102 in parallel. As an example, consider access of a single magnetic domain.

During the domain movement, the data from the magnetic domains ahead of the selected magnetic domain is read by the first reader 1106a and stored in the temporary memory 1104, before the magnetic domains are moved beyond the available position on the magnetic column. This operation is performed for all of the magnetic columns 1102 in the chain of magnetic columns 1102. The temporary memory 1104 is of equal or greater capacity than the sum of the chain of magnetic columns 1102.

After the selected magnetic domain is accessed, the direction of movement is reversed (i.e., away from the first reader 1106a), and the data travels down the first magnetic column 1102a, where the data is written back from the temporary memory 1104 onto the first magnetic column 1102a by the first writer 1108a, thereby restoring the original content of the first magnetic column 1102a, with the bit information in the accessed magnetic domain either also restored or else rewritten to a new intended data state if so required by a desired cell write operation. At the same time, data for other magnetic columns 1102 will also be restored in the same manner.

Those skilled in the art will appreciate that the device 1100 is illustrated as comprising three magnetic columns 1106 and two reader/writer pairs for the purposes of simplicity only. A magnetic shift register memory device configured according to the embodiment illustrated in FIG. 11 may comprise any number of magnetic columns and reader/writer pairs configured substantially as illustrated.

Figure 12:
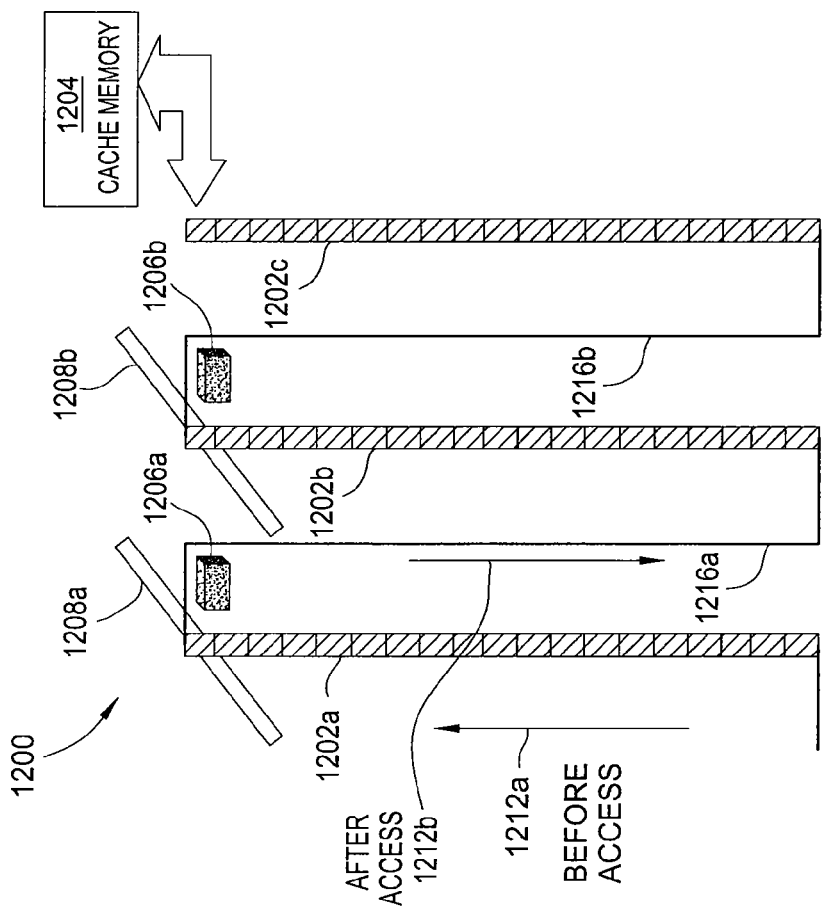
FIG. 12 is a schematic diagram illustrating a twelfth embodiment of a magnetic shift register memory device, according to the present invention.

FIG. 12 is a schematic diagram illustrating a twelfth embodiment of a magnetic shift register memory device 1200, according to the present invention. As illustrated, the device 1200 comprises a plurality of magnetic columns 1202a-1202c (hereinafter collectively referred to as "magnetic columns 1202", each containing a plurality of magnetic domains), a first reader 1206a, a second reader 1206b, a first writer 1208a, a second writer 1208b, and a temporary memory (e.g., cache memory) 1204.

The plurality of magnetic columns 1202 is arranged in a chain configuration such that adjacent magnetic columns 1202 are electrically connected along the wordline dimension of the device 1200. In addition, a plurality of vias 1216a-1216b (hereinafter collectively referred to as "vias 1216") connects the plurality of magnetic columns 1202.

The first reader 1206a and first writer 1208a are positioned at a first end of the first magnetic column 1202a, while the second reader 1206b and the second writer 1208b are positioned at a laterally adjacent first end of the second magnetic column 1202b. Thus, each magnetic column 1202 has a reader/writer pair positioned at its first end.

To access a particular magnetic domain in any of the magnetic columns 1202, the entire chain of magnetic columns 1202 must be moved. It is most efficient to access at least some of the magnetic domains from several of the magnetic columns 1202 in parallel. As an example, consider access of a single magnetic domain.

During the domain movement, the data from the magnetic domains ahead of the selected magnetic domain is read by the first reader 1206a and stored in the temporary memory 1204, before the magnetic domains are moved beyond the available position on the magnetic column. This operation is performed for all of the magnetic columns 1202 in the chain of magnetic columns 1202. The temporary memory 1204 is of equal or greater capacity than the sum of the chain of magnetic columns 1202.

After the selected magnetic domain is accessed, the direction of movement is reversed (i.e., away from the first reader 1206a), and the data travels down the first magnetic column 1202a, where the data is written back from the temporary memory 1204 onto the first magnetic column 1202a by the first writer 1208a, thereby restoring the original content of the first magnetic column 1202a, with the bit information in the accessed magnetic domain either also restored or else rewritten to a new intended data state if so required by a desired cell write operation. At the same time, data for other magnetic columns 1202 will also be restored in the same manner.

Those skilled in the art will appreciate that the device 1200 is illustrated as comprising three magnetic columns 1206 and two reader/writer pairs for the purposes of simplicity only. A magnetic shift register memory device configured according to the embodiment illustrated in FIG. 12 may comprise any number of magnetic columns and reader/writer pairs configured substantially as illustrated.

FIG. 13 is a schematic diagram illustrating a thirteenth embodiment of a magnetic shift register memory device 1300, according to the present invention. As illustrated, the device 1300 comprises a plurality of magnetic columns 1302a-1302c (hereinafter collectively referred to as "magnetic columns 1302", each containing a plurality of magnetic domains), a first reader 1306a, a second reader 1306b, a first writer 1308a, a second writer 1308b, and a temporary memory (e.g., cache memory) 1304.

The plurality of magnetic columns 1302 is arranged in a chain configuration such that adjacent magnetic columns 1302 are electrically connected along the wordline dimension of the device 1300. In addition, a plurality of vias 1316a-1316b (hereinafter collectively referred to as "vias 1316") connects the plurality of magnetic columns 1302.

The first reader 1306a and first writer 1308a are positioned at a first end of the first magnetic column 1302a, while the second reader 1306b and the second writer 1308b are positioned at a laterally adjacent first end of the second magnetic column 1302b. Thus, each magnetic column 1302 has a reader/writer pair positioned at either its first end or its second end.

To access a particular magnetic domain in any of the magnetic columns 1302, the entire chain of magnetic columns 1302 must be moved. It is most efficient to access at least some of the magnetic domains from several of the magnetic columns 1302 in parallel. As an example, consider access of a single magnetic domain.

During the domain movement, the data from the magnetic domains ahead of the selected magnetic domain is read by the first reader 1306a and stored in the temporary memory 1304, before the magnetic domains are moved beyond the available position on the magnetic column. This operation is performed for all of the magnetic columns 1302 in the chain of magnetic columns 1302. The temporary memory 1304 is of equal or greater capacity than the sum of the chain of magnetic columns 1302.

After the selected magnetic domain is accessed, the direction of movement is reversed (i.e., away from the first reader 1306a), and the data travels up the first magnetic column 1302a, where the data is written back from the temporary memory 1304 to the first magnetic domain of the second magnetic column 1302b by the second writer 1308b, thereby restoring the original content of the first magnetic column 1302a, with the bit information in the accessed magnetic domain either also restored or else rewritten to a new intended data state if so required by a desired cell write operation. At the same time, data for other magnetic columns 1302 will also be restored in the same manner.

Those skilled in the art will appreciate that the device 1300 is illustrated as comprising three magnetic columns 1306 and two reader/writer pairs for the purposes of simplicity only. A magnetic shift register memory device configured according to the embodiment illustrated in FIG. 13 may comprise any number of magnetic columns and reader/writer pairs configured substantially as illustrated.

Similar to the devices 100-1000 illustrated in FIGS. 1-10, the configuration of the devices 1100-1300 illustrated in FIGS. 11-13 advantageously eliminates or reduces the need for reservoirs, which add length to the magnetic columns in conventional magnetic shift register memory devices. This reduction in magnetic column length allows a greater number of magnetic domains to be moved along the magnetic column in a single move operation (i.e., by a single application of electrical current). Additionally, configuring the magnetic columns as a chain allows for continuous movement of magnetic domains along the chain, thereby eliminating the need for a semiconductor device similar to those illustrated in FIGS. 1-5 to control domain movement.

FIG. 14 is a schematic diagram illustrating a fourteenth embodiment of a magnetic shift register memory device 1400, according to the present invention. As illustrated, the device 1400 comprises a plurality of magnetic columns 1402a-1402c (hereinafter collectively referred to as "magnetic columns 1402", each containing a plurality of magnetic domains), a first reader 1406a, a second reader 1406b, a first writer 1408a, and a second writer 1408b.

The plurality of magnetic columns 1402 is arranged in a chain configuration such that adjacent magnetic columns 1402 are electrically connected along the wordline dimension of the device 1400. In addition, each magnetic column 1402 includes at least one "dummy" domain 1418a-1418c (hereinafter collectively referred to as "dummy domains 1418") that prevents writing of nondummy magnetic domains.

The first reader 1406a and first writer 1408a are positioned at a first end of the first magnetic column 1402a, while the second reader 1406b and the second writer 1408b are positioned at an opposite second end of the second magnetic column 1402b. Thus, each magnetic column 1402 has a reader/writer pair positioned at either its first end or its second end. In one embodiment, a magnetic column 1402's respective dummy domain 1418 is also positioned at the same end of the magnetic column 1402 as the reader/writer pair (e.g., such that the dummy domain 1418 is adjacent to the writer 1408).

To access a particular magnetic domain in any of the magnetic columns 1402, the entire chain of magnetic columns 1402 must be moved. It is most efficient to access at least some of the magnetic domains from several of the magnetic columns 1402 in parallel. As an example, consider access of a single magnetic domain:

During the domain movement, the data from the magnetic domains ahead of the selected magnetic domain is read by the first reader 1406a and stored in the temporary memory 1404. This operation is performed for all of the magnetic columns 1402 in the chain of magnetic columns 1402. The temporary memory 1404 is of equal or greater capacity than the sum of the chain of magnetic columns 1402.

In addition to the magnetic columns 1402 illustrated, a plurality of identical chains is repeated in the bit-line direction (i.e., out of the page). When the selected chain of magnetic columns 1402 is accessed for writing, the magnetic domains in all of the other chains of magnetic columns 1402 remain in position, such that the writers 1408 are adjacent to the dummy domains 1418. This allows the writers 1408 to be shared by multiple chains of magnetic columns and reduces the cost of the magnetic shift register memory device 1400.

FIG. 15 is a schematic diagram illustrating a fifteenth embodiment of a magnetic shift register memory device 1500, according to the present invention. As illustrated, the device 1500 comprises a plurality of magnetic columns 1502a-1502c (hereinafter collectively referred to as "magnetic columns 1502", each containing a plurality of magnetic domains), a first reader 1506a, a second reader 1506b, a first writer 1508a, and a second writer 1508b.

The plurality of magnetic columns 1502 is arranged in a chain configuration such that adjacent magnetic columns 1502 are electrically connected along the wordline dimension of the device 1500. In addition, a plurality of vias 1516a-1516b (hereinafter collectively referred to as "vias 1516") connects the plurality of magnetic columns 1502. Each magnetic column 1502 also includes at least one "dummy" domain 1518a-1518c (hereinafter collectively referred to as "dummy domains 1518").

The first reader 1506a and first writer 1508a are positioned at a first end of the first magnetic column 1502a, while the second reader 1506b and the second writer 1508b are positioned at an adjacent first end of the second magnetic column 1502b. Thus, each magnetic column 1502 has a reader/writer pair positioned at its first end. In one embodiment, a magnetic column 1502's respective dummy domain 1518 is also positioned at the first end the magnetic column 1502 (e.g., such that the dummy domain 1518 is adjacent to the writer 1508).

To access a particular magnetic domain in any of the magnetic columns 1502, the entire chain of magnetic columns 1502 must be moved. It is most efficient to access at least some of the magnetic domains from several of the magnetic columns 1502 in parallel. As an example, consider access of a single magnetic domain:

During the domain movement, the data from the magnetic domains ahead of the selected magnetic domain is read by the first reader 1506a and stored in the temporary memory 1504. This operation is performed for all of the magnetic columns 1502 in the chain of magnetic columns 1502. The temporary memory 1504 is of equal or greater capacity than the sum of the chain of magnetic columns 1502.

In addition to the magnetic columns 1502 illustrated, a plurality of identical chains is repeated in the bit-line direction (i.e., out of the page). When the selected chain of magnetic columns 1502 is accessed for writing, the magnetic domains in all of the other chains of magnetic columns 1502 remain in position, such that the writers 1508 are adjacent to the dummy domains 1518. This allows the writers 1508 to be shared by multiple chains of magnetic columns and reduces the cost of the magnetic shift register memory device 1500.

Similar to the devices 100-1300 illustrated in FIGS. 1-13, the configuration of the devices 1400-1500 illustrated in FIGS. 14-15 advantageously eliminates or reduces the need for reservoirs, which add length to the magnetic columns in conventional magnetic shift register memory devices. This reduction in magnetic column length allows a greater number of magnetic domains to be moved along the magnetic column in a single move operation (i.e., by a single application of electrical current). Additionally, configuring the magnetic columns as a chain allows for continuous movement of magnetic domains along the chain, thereby eliminating the need for a semiconductor device similar to those illustrated in FIGS. 1-5 to control domain movement. Moreover, because other magnetic columns (i.e., other than the magnetic column in which the selected magnetic domain resides) remain in the "dummy" position during write operations, the semiconductor device that controls the writing can be shared by the plurality of magnetic columns, thereby reducing the size and fabrication cost of the device 1400 or 1500. Only a small semiconductor device is required for the reader; controls for writing and domain movement are shared.

Those skilled in the art will appreciate that the devices 1400 and 1500 are illustrated as comprising three magnetic columns and two reader/writer pairs for the purposes of simplicity only. A magnetic shift register memory device configured according to the embodiments illustrated in FIGS. 14 and 15 may comprise any number of magnetic columns and reader/writer pairs configured substantially as illustrated.

FIG. 16 is a schematic diagram illustrating a sixteenth embodiment of a magnetic shift register memory device 1600, according to the present invention. As illustrated, the device 1600 comprises a plurality of magnetic columns 1602*a*-1602*c* (hereinafter collectively referred to as "magnetic columns 1602", each containing a plurality of magnetic domains), a first reader 1606*a*, a second reader 1606*b*, a first writer 1608*a*, and a second writer 1608*b*.

The plurality of magnetic columns 1602 is arranged in a chain configuration such that adjacent magnetic columns 1602 are electrically connected along the wordline dimension of the device 1600. Each magnetic column 1602 includes at least one "dummy" domain 1618*a*-1618*c* (hereinafter collectively referred to as "dummy domains 1618") and at least one reservoir 1620*a*-1620*c* (hereinafter collectively referred to as "reservoirs 1620").

The first reader 1606*a* and first writer 1608*a* are positioned near the middle of the first magnetic column 1602*a*, while the second reader 1606*b* and the second writer 1608*b* are positioned near the middle of the second magnetic column 1602*b*. Thus, each magnetic column 1602 has a reader/writer pair at an intermediate position. In one embodiment, a magnetic column 1602's respective dummy domain 1618 is also positioned near the middle of the magnetic column 1602 (e.g., such that the dummy domain 1618 is adjacent to the writer 1608).

The reservoir 1620 for a given magnetic column 1602 is positioned either above or below the dummy domain 1618 and reader/writer pair. While moving through the chain of magnetic columns, reservoirs 1620 are generally positioned between a series of magnetic domains containing data (e.g., non-"dummy" domains) and a dummy domain 1618.

To access a particular magnetic domain in any of the magnetic columns 1602, the entire chain of magnetic columns 1602 must be moved. It is most efficient to access at least some of the magnetic domains from several of the magnetic columns 1602 in parallel. As an example, consider access of a single magnetic domain:

In addition to the magnetic columns 1602 illustrated, a plurality of identical chains is repeated in the bit-line direction (i.e., out of the page). When the selected chain of magnetic columns 1602 is accessed for writing, the magnetic domains in all of the other chains of magnetic columns 1602 remain in position, such that the writers 1608 are adjacent to the dummy domains 1618. This allows the writers 1608 to be shared by multiple chains of magnetic columns and reduces the cost of the magnetic shift register memory device 1600.

Figure 17:
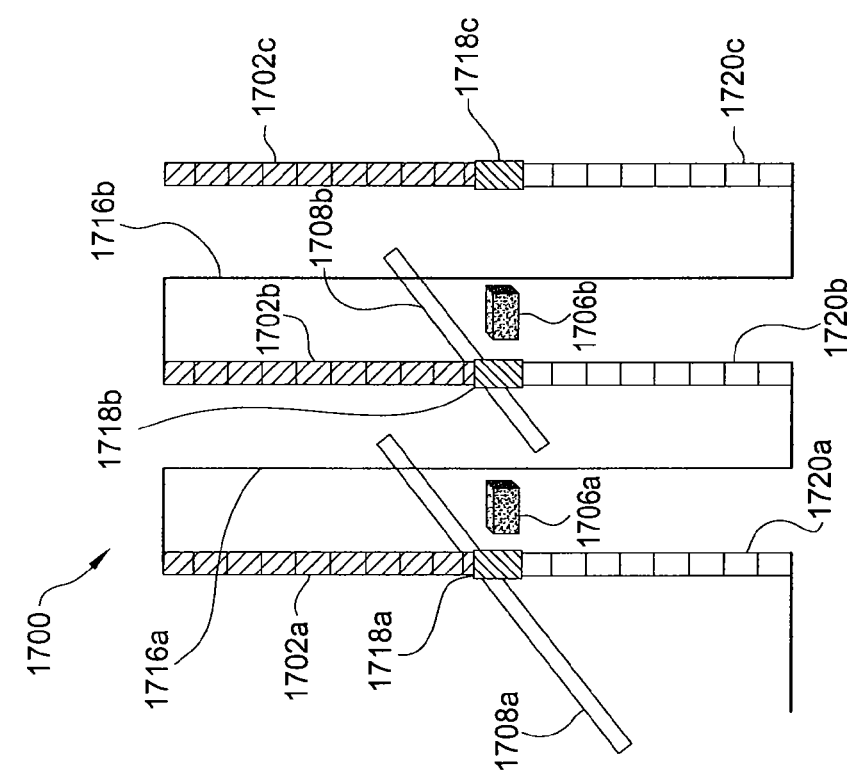
FIG. 17 is a schematic diagram illustrating a seventeenth embodiment of a magnetic shift register memory device, according to the present invention.

FIG. 17 is a schematic diagram illustrating a seventeenth embodiment of a magnetic shift register memory device 1700, according to the present invention. As illustrated, the device 1700 comprises a plurality of magnetic columns 1702*a*-1702*c* (hereinafter collectively referred to as "magnetic columns 1702", each containing a plurality of magnetic domains), a first reader 1706*a*, a second reader 1706*b*, a first writer 1708*a*, and a second writer 1708*b*.

The plurality of magnetic columns 1702 is arranged in a chain configuration such that adjacent magnetic columns 1702 are electrically connected along the wordline dimension of the device 1700. In addition, a plurality of vias 1716*a*-1716*b* (hereinafter collectively referred to as "vias 1716") connects the plurality of magnetic columns 1702. Each magnetic column 1702 also includes at least one "dummy" domain 1718*a*-1718*c* (hereinafter collectively referred to as "dummy domains 1718").

The first reader 1706*a* and first writer 1708*a* are positioned near the middle of the first magnetic column 1702*a*, while the second reader 1706*b* and the second writer 1708*b* are positioned near the middle of the second magnetic column 1702*b*. Thus, each magnetic column 1702 has a reader/writer pair at an intermediate position. In one embodiment, a magnetic column 1702's respective dummy domain 1718 is also positioned near the middle of the magnetic column 1702 (e.g., such that the dummy domain 1718 is adjacent to the writer 1708).

The reservoir 1720 for a given magnetic column 1702 is positioned below the dummy domain 1718 and reader/writer pair. While moving through the chain of magnetic columns, reservoirs 1720 are generally positioned between a via 1716 and a dummy domain 1718.

To access a particular magnetic domain in any of the magnetic columns 1702, the entire chain of magnetic columns 1702 must be moved. It is most efficient to access at least some of the magnetic domains from several of the magnetic columns 1702 in parallel. As an example, consider access of a single magnetic domain:

In addition to the magnetic columns 1702 illustrated, a plurality of identical chains is repeated in the bit-line direction (i.e., out of the page). When the selected chain of magnetic columns 1702 is accessed for writing, the magnetic domains in all of the other chains of magnetic columns 1702 remain in position, such that the writers 1708 are adjacent to the dummy domains 1718. This allows the writers 1708 to be shared by multiple chains of magnetic columns and reduces the cost of the magnetic shift register memory device.

Similar to the devices 1400-1500 illustrated in FIGS. 14-15, the configuration of the devices 1600-1700 illustrated in FIGS. 16-17 advantageously reduces the size and fabrication cost of a magnetic shift register memory device, because other magnetic columns (i.e., other than the magnetic column in which the selected magnetic domain resides) remain in the "dummy" position during write operations, the semiconductor device that controls the writing can be shared by the plurality of magnetic columns, thereby. Only a small semiconductor device is required for the reader; controls for writing and domain movement are shared. Additionally, configuring the magnetic columns as a chain allows for continuous movement of magnetic domains along the chain, thereby eliminating the need for a semiconductor device similar to those illustrated in FIGS. 1-5 to control domain movement.

Those skilled in the art will appreciate that the devices 1600 and 1700 are illustrated as comprising three magnetic columns and two reader/writer pairs for the purposes of simplicity only. A magnetic shift register memory device configured according to the embodiments illustrated in FIGS. 16 and 17 may comprise any number of magnetic columns and reader/writer pairs configured substantially as illustrated. In addition, those skilled in the art will recognize that any of the magnetic shift register memory devices illustrated in FIGS. 1-13 can be adapted to include the dummy domain, reservoirs, and/or associated functionality.

Figure 18:
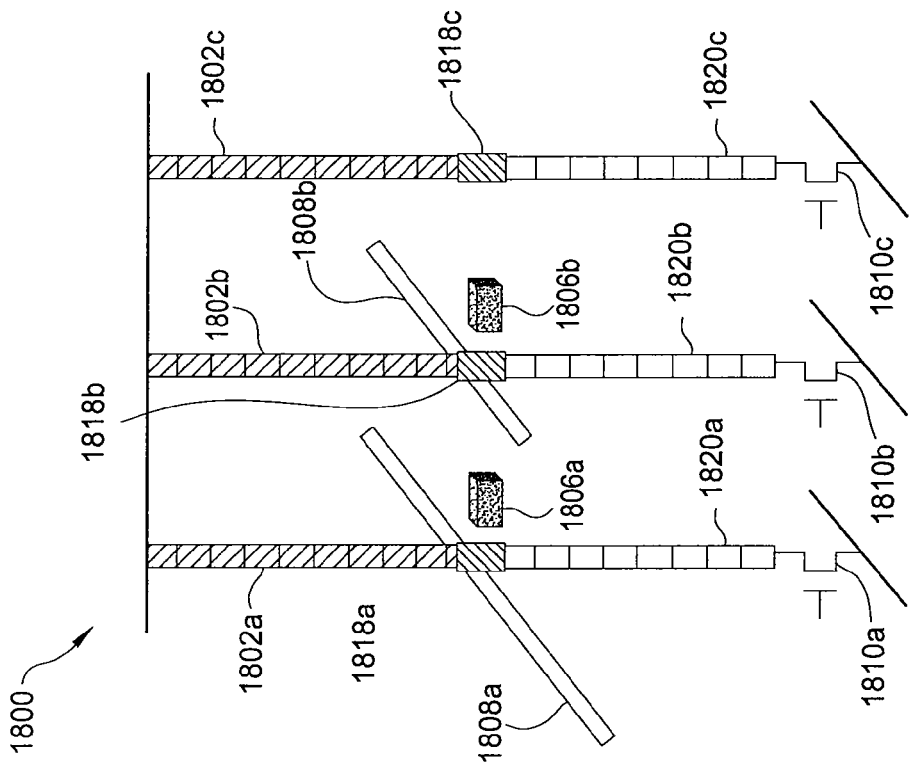
FIG. 18 is a schematic diagram illustrating a eighteenth embodiment of a magnetic shift register memory device, according to the present invention.

FIG. 18 is a schematic diagram illustrating an eighteenth embodiment of a magnetic shift register memory device 1800, according to the present invention. As illustrated, the device 1800 comprises a plurality of magnetic columns 1802a-1802c (hereinafter collectively referred to as "magnetic columns 1802", each containing a plurality of magnetic domains), a first reader 1806a, a second reader 1806b, a first writer 1808a, a second writer 1808b, a first semiconductor device 1810a, a second semiconductor device 1810b, and a third semiconductor device 1810c. Each magnetic column 1802 further includes at least one "dummy" domain 1818a-1818c (hereinafter collectively referred to as "dummy domains 1818") and at least one reservoir 1820a-1820c (hereinafter collectively referred to as "reservoirs 1820").

The first reader 1806a and first writer 1808a are positioned near the middle of the first magnetic column 1802a, while the second reader 1806b and the second writer 1808b are positioned near the middle of the second magnetic column 1802b. Thus, each magnetic column 1802 has a reader/writer pair at an intermediate position. In one embodiment, a magnetic column 1802's respective dummy domain 1818 is also positioned near the middle of the magnetic column 1802 (e.g., such that the dummy domain 1818 is adjacent to the writer 1808).

The reservoir 1820 for a given magnetic column 1802 is positioned below the dummy domain 1818 and reader/writer pair. Generally, reservoirs 1820 are positioned between the dummy domain 1818 and the semiconductor device 1810 that controls domain movement in a given magnetic column 1802.

In addition to the magnetic columns 1802 illustrated, a plurality of identical chains is repeated in the bit-line direction (i.e., out of the page). When the selected chain of magnetic columns 1802 is accessed for writing, the magnetic domains in all of the other chains of magnetic columns 1802 remain in position, such that the writers 1808 are adjacent to the dummy domains 1818. This allows the writers 1808 to be shared by multiple chains of magnetic columns and reduces the cost of the magnetic shift register memory device.

Similar to the devices 1400-1700 illustrated in FIGS. 14-17, the configuration of the device 1800 illustrated in FIG. 18 advantageously reduces the size and fabrication cost of a magnetic shift register memory device, because other magnetic columns (i.e., other than the magnetic column in which the selected magnetic domain resides) remain in the "dummy" position during write operations, the semiconductor device that controls the writing can be shared by the plurality of magnetic columns, thereby. Only a small semiconductor device is required for the reader; controls for writing and domain movement are shared.

While the foregoing is directed to embodiments of the present invention, other and further embodiments of the invention may be devised without departing from the basic scope thereof. Various embodiments presented herein, or portions thereof, may be combined to create further embodiments. Furthermore, terms such as top, side, bottom, front, back, and the like are relative or positional terms and are used with respect to the exemplary embodiments illustrated in the figures, and as such these terms may be interchangeable.

What is claimed is:

1. A memory cell, comprising:
    at least two chains of magnetic columns, wherein at least one of the at least two chains of magnetic columns is oriented in a bit-line direction relative to at least another of the at least two chains of magnetic columns, wherein each of the at least two chains of magnetic columns comprises:
        a plurality of magnetic columns, each of the plurality of magnetic columns comprising a plurality of magnetic domains,
        wherein the plurality of magnetic columns is electrically connected along a dimension of the memory cell to create a path that moves the plurality of magnetic domains up and down the plurality of magnetic columns in an alternating manner;
    at least one reader coupled to the at least two chains of magnetic columns, for reading data from the plurality of magnetic domains in each of the at least two chains of magnetic columns;
    a temporary memory for storing the data; and
    at least one writer coupled to the at least two chains of magnetic columns, for writing the data in the temporary memory to the plurality of magnetic domains in each of the at least two chains of magnetic columns.

2. The memory cell of claim 1, wherein each of the at least two chains of magnetic columns further comprises:
    a semiconductor device for controlling movement of the plurality of magnetic domains along the plurality of magnetic columns.

3. The memory cell of claim 1, wherein the temporary memory is of equal or greater storage capacity than a cumulative storage capacity of the plurality of magnetic columns in at least one of the at least two chains of magnetic columns.

4. The memory cell of claim 1, wherein the at least one reader and the at least one writer comprise a plurality of reader/writer pairs, each of the plurality of reader/writer pairs being positioned at one end of a different one of the plurality of magnetic columns of one of the at least two chains of magnetic columns.

5. The memory cell of claim 4, wherein the plurality of reader/writer pairs comprises:
    a first reader/writer pair positioned at a first end of a first one of the plurality of magnetic columns of the one of the at least two chains of magnetic columns; and
    a second reader/writer pair positioned at an opposite second end of a second one of the plurality of magnetic columns of the one of the at least two chains of magnetic columns.

6. The memory cell of claim 1, wherein each of the at least two chains of magnetic columns further comprises:
a plurality of vias electrically connecting the plurality of magnetic columns.

7. The memory cell of claim 1, wherein the alternating manner comprises moving the plurality of magnetic domains up a first one of the plurality of magnetic columns and immediately subsequently down a second one of the plurality of magnetic columns, where the first one of the plurality of magnetic columns is adjacent to the second one of the plurality of magnetic columns.

8. The memory cell of claim 4, wherein the plurality of reader/writer pairs comprises:
a first reader/writer pair positioned at a first end of a first one of the plurality of magnetic columns of one of the at least two chains of magnetic columns; and
a second reader/writer pair positioned at a first end of a second one of the plurality of magnetic columns of the one of the at least two chains of magnetic columns,
wherein the first end of the first one of the plurality of magnetic columns and the first end of the second one of the plurality of magnetic columns are laterally adjacent to each other.

9. The memory cell of claim 8, wherein each of the at least two chains of magnetic columns further comprises:
a plurality of vias electrically connecting the plurality of magnetic columns.

10. A memory cell, comprising:
at least two chains of magnetic columns, wherein at least one of the at least two chains of magnetic columns is oriented in a bit-line direction relative to at least another of the at least two chains of magnetic columns, wherein each of the at least two chains of magnetic columns comprises:
a plurality of magnetic columns, each of the plurality of magnetic columns comprising a plurality of magnetic domains,
wherein the plurality of magnetic columns is electrically connected along a dimension of the memory cell to create a path that moves the plurality of magnetic domains up and down the plurality of magnetic columns in an alternating manner;
at least one reader coupled to the at least two chains of magnetic columns, for reading data from the plurality of magnetic domains in each of the at least two chains of magnetic columns; and
at least one writer coupled to the at least two chains of magnetic columns, for writing the data to the plurality of magnetic domains in each of the at least two chains of magnetic columns.

11. The memory cell of claim 10, wherein each of the at least two chains of magnetic columns further comprises:
a semiconductor device for controlling movement of the plurality of magnetic domains along the plurality of magnetic columns.

12. The memory cell of claim 10, wherein the at least one reader and the at least one writer comprise a plurality of reader/writer pairs, each of the plurality of reader/writer pairs being positioned at one end of a different one of the plurality of magnetic columns in at least one of the two chains of magnetic columns.

13. The memory cell of claim 12, wherein the plurality of reader/writer pairs comprises:
a first reader/writer pair positioned at a first end of a first one of the plurality of magnetic columns of the one of the at least two chains of magnetic columns; and
a second reader/writer pair positioned at an opposite second end of a second one of the plurality of magnetic columns of the one of the at least two chains of magnetic columns.

14. The memory cell of claim 12, wherein the plurality of reader/writer pairs comprises:
a first reader/writer pair positioned at a first end of a first one of the plurality of magnetic columns of the one of the at least two chains of magnetic columns; and
a second reader/writer pair positioned at a first end of a second one of the plurality of magnetic columns of the one of the at least two chains of magnetic columns,
wherein the first end of the first one of the plurality of magnetic columns and the first end of the second one of the plurality of magnetic columns are laterally adjacent to each other.

15. The memory cell of claim 14, wherein each of the at least two chains of magnetic columns further comprises:
a plurality of vias electrically connecting the plurality of magnetic columns.

16. The memory cell of claim 10, wherein the alternating manner comprises moving the plurality of magnetic domains up a first one of the plurality of magnetic columns and immediately subsequently down a second one of the plurality of magnetic columns, where the first one of the plurality of magnetic columns is adjacent to the second one of the plurality of magnetic columns.

17. A memory cell, comprising:
at least two chains of magnetic columns, wherein at least one of the at least two chains of magnetic columns is oriented in a bit-line direction relative to at least another of the at least two chains of magnetic columns, wherein each of the at least two chains of magnetic columns comprises at least one magnetic column comprising a plurality of magnetic domains;
at least one reader coupled to the at least two chains of magnetic columns, for reading data from the plurality of magnetic domains in each of the at least two chains of magnetic columns;
at least one writer coupled to the at least two chains of magnetic columns, for writing the data to the plurality of magnetic domains in each of the at least two chains of magnetic columns.

18. The memory cell of claim 17, further comprising:
a temporary memory for storing the data, wherein the temporary memory is of an equal or greater storage capacity than the at least one magnetic column in one of the at least two chains of magnetic columns.

* * * * *